United States Patent
Xu et al.

[19]

[11] Patent Number: 6,136,095
[45] Date of Patent: Oct. 24, 2000

[54] APPARATUS FOR FILLING APERTURES IN A FILM LAYER ON A SEMICONDUCTOR SUBSTRATE

[75] Inventors: Zheng Xu, Foster City; John Forster, San Francisco; Tse-Yong Yao, Sunnyvale, all of Calif.

[73] Assignee: Applied Materials, Inc., Santa Clara, Calif.

[21] Appl. No.: 08/939,741

[22] Filed: Oct. 6, 1997

Related U.S. Application Data

[62] Division of application No. 08/511,825, Aug. 7, 1995, Pat. No. 5,962,923.

[51] Int. Cl.[7] .................................................. C23C 16/00
[52] U.S. Cl. .................... 118/719; 118/726; 438/649; 438/654; 438/655; 438/675; 257/754; 257/758; 257/767; 257/768
[58] Field of Search .................... 438/649, 654, 438/655, 675, 688; 257/754, 758, 767, 768, 780; 118/719, 726

[56] References Cited

U.S. PATENT DOCUMENTS

| | | | |
|---|---|---|---|
| 3,437,864 | 4/1969 | Kofoid et al. | 313/231 |
| 3,616,452 | 10/1971 | Bessot et al. | 204/298 |
| 3,619,403 | 11/1971 | Gorin | 204/312 |
| 3,649,502 | 3/1972 | Herte et al. | 204/192 |
| 3,699,034 | 10/1972 | Lins et al. | 204/192 |
| 3,705,091 | 12/1972 | Jacob | 204/312 |
| 3,873,884 | 3/1975 | Gabriel | 315/267 |
| 3,875,068 | 4/1975 | Mitzel | 250/531 |
| 3,879,597 | 4/1975 | Bersin et al. | 219/121 P |
| 4,123,316 | 10/1978 | Tsuchimoto | 156/643 |
| 4,233,109 | 11/1980 | Nishizawa | 156/643 |
| 4,351,712 | 9/1982 | Cumo et al. | 204/192 |
| 4,362,632 | 12/1982 | Jacob | 422/183.04 |
| 4,368,092 | 1/1983 | Steinberg et al. | 156/345 |
| 4,421,592 | 12/1983 | Shuskus et al. | 156/613 |
| 4,431,898 | 2/1984 | Reinberg et al. | 219/121 PG |
| 4,431,901 | 2/1984 | Hull | 219/121 PR |
| 4,668,338 | 5/1987 | Maydan et al. | 156/643 |

(List continued on next page.)

FOREIGN PATENT DOCUMENTS

| | | | |
|---|---|---|---|
| 0655780 | 5/1995 | European Pat. Off. | H01L 21/768 |
| 04027163 | 1/1992 | Japan | H01L 29/46 |
| 10237639 | 9/1998 | Japan | C23C 14/34 |

OTHER PUBLICATIONS

G. A. Dixit et al., "Reactively sputtered titanium nitride films for submicron contact barrier metallization", *Appl. Phys. Lett.*, vol. 62, No. 4, pp. 357–359 (Jan 1993).

S. N. Mei et al., "Nonconformal Al via filling and planariation by partially ionized beam deposition for multilevel interconnection", *I.E.E.E. Electron Device Letters*, EDL–8, No. 10, pp. 503–505 (Oct. 1987).

S. M. Rossnagel and J. Hopwood, "Metal ion deposition from ionized magnetron sputtering discharge", *J. Vac. Sci. Technol.* B, vol. 12, No. 1, pp. 449–453, (1994).

*Primary Examiner*—David Nelms
*Assistant Examiner*—Reneé R. Berry
*Attorney, Agent, or Firm*—Kenyon & Kenyon; Shirley L. Church

[57] ABSTRACT

The present invention pertains to a carrier layer and a contact enabled by the carrier layer which enables the fabrication of aluminum (including aluminum alloys and other conductive materials having a similar melting point) electrical contacts in multilayer integrated circuit vias, through holes, or trenches having an aspect ratio greater than one. In fact, the structure has been shown to enable such contact fabrication in vias, through holes, and trenches having aspect ratios as high as at least 5:1, and should be capable of filing apertures having aspect ratios up to about 12:1. The carrier layer, in addition to permitting the formation of a conductive contact at high aspect ratio, provides a diffusion barrier which prevents the aluminum from migrating into surrounding substrate material which operates in conjunction with the electrical contact. The carrier layer preferably comprises a layer formed by ionizing the flux of sputter deposition material, partially reacting the flux with a gas, and depositing the resulting material on a substrate.

10 Claims, 4 Drawing Sheets

U.S. PATENT DOCUMENTS

| | | | |
|---|---|---|---|
| 4,668,365 | 5/1987 | Foster et al. | 204/192.23 |
| 4,686,113 | 8/1987 | Delfino et al. | 427/45.1 |
| 4,716,491 | 12/1987 | Ohno et al. | 361/230 |
| 4,810,935 | 3/1989 | Boswell | 315/111.42 |
| 4,844,775 | 7/1989 | Keeble | 156/643 |
| 4,849,675 | 7/1989 | Muller | 315/111.51 |
| 4,859,908 | 8/1989 | Yoshida et al. | 315/111.81 |
| 4,911,814 | 3/1990 | Matsuoka et al. | 204/298 |
| 4,918,031 | 4/1990 | Flamm et al. | 437/225 |
| 4,948,458 | 8/1990 | Ogle | 156/643 |
| 4,951,601 | 8/1990 | Maydan et al. | 118/719 |
| 4,990,229 | 2/1991 | Campbell et al. | 204/298.06 |
| 4,999,096 | 3/1991 | Nihei et al. | 204/192.3 |
| 5,018,479 | 5/1991 | Markunas et al. | 118/723 |
| 5,108,570 | 4/1992 | Wang | 204/192.3 |
| 5,146,137 | 9/1992 | Gesche et al. | 315/111.21 |
| 5,171,412 | 12/1992 | Talieh et al. | 204/192.15 |
| 5,178,739 | 1/1993 | Barnes et al. | 204/192.1 |
| 5,186,718 | 2/1993 | Tepman et al. | 29/25.01 |
| 5,225,740 | 7/1993 | Ohkawa | 315/111.41 |
| 5,231,334 | 7/1993 | Paranjpe | 315/111.21 |
| 5,240,880 | 8/1993 | Hindman et al. | 437/190 |
| 5,290,731 | 3/1994 | Sugano et al. | 437/174 |
| 5,338,423 | 8/1994 | Hindman et al. | 204/192.12 |
| 5,354,443 | 10/1994 | Moslehi | 204/192.12 |
| 5,358,616 | 10/1994 | Ward | 204/192.15 |
| 5,371,042 | 12/1994 | Ong | 437/194 |
| 5,378,660 | 1/1995 | Ngan et al. | 437/247 |
| 5,397,962 | 3/1995 | Moslehi | 315/111.51 |
| 5,406,123 | 4/1995 | Narayan | 257/767 |
| 5,430,355 | 7/1995 | Paranjpe | 315/111.21 |
| 5,435,881 | 7/1995 | Ogle | 156/345 |
| 5,514,908 | 5/1996 | Liao et al. | 257/751 |
| 5,525,837 | 6/1996 | Choudhury | 257/751 |
| 5,565,708 | 10/1996 | Ohsaki et al. | 257/764 |
| 5,644,166 | 7/1997 | Honeycutt et al. | 257/754 |
| 5,658,828 | 8/1997 | Lin et al. | 438/643 |
| 5,695,564 | 12/1997 | Imahashi | 118/719 |
| 5,911,113 | 6/1999 | Yao et al. | 438/649 |

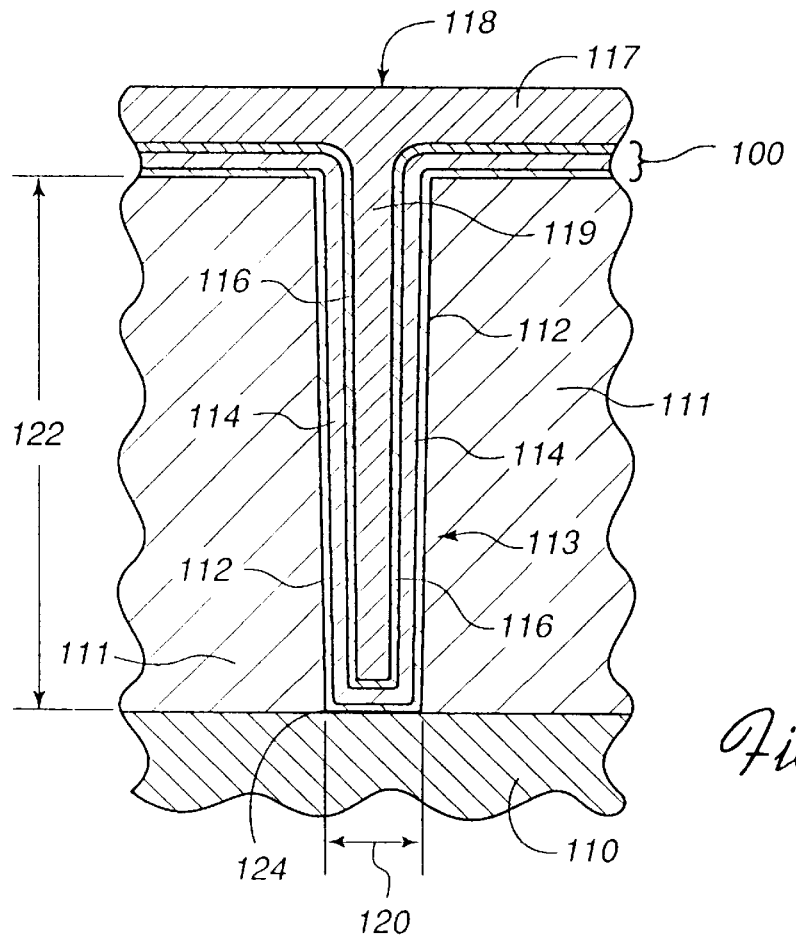
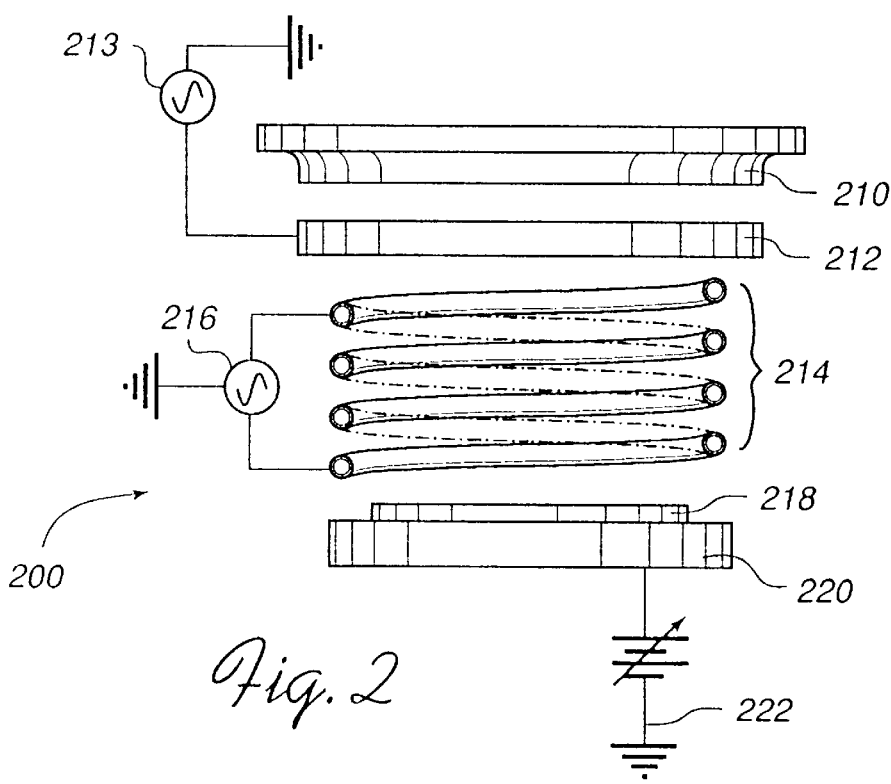

APPARATUS FOR FILLING APERTURES IN A FILM LAYER ON A SEMICONDUCTOR SUBSTRATE

This is a division of application Ser. No. 08/511,825 filed Aug. 7, 1995, now U.S. Pat. No. 5,962,923.

BACKGROUND OF THE INVENTION

1. Field of the Invention

The present invention pertains to contacts, vias and other pathways formed in film layers of semiconductor devices, and to the lining or filling of apertures, such as vias, holes or trenches extending through one or more film layers on a semiconductor or other type of substrate, to create the pathway through the film layer. The invention enables the filling of high aspect ratio apertures (i.e., those having a ratio of height to width of from about 1:0 to about 12:0 and a width of as small as 1000 angstroms) and planarization of the deposited film layer at reduced temperatures as compared to prior art methods, and, in some cases, where traditional prior art methods cannot provide void free filling of the aperture and planarization of the resulting film layer in reasonable periods of time. In one sub-embodiment, the invention pertains to a carrier layer, to the structure and composition of the carrier layer, to methods for forming the carrier layer, and to the equipment used to practice the methods for forming the carrier layer, all of which enable the filling of high aspect ratio electrical contacts and planarization of the deposited film layer during the fabrication of integrated circuit devices.

2. Description of the Background Art

During the fabrication of integrated circuit devices on a substrate or wafer, it becomes necessary to fill holes, trenches or vias (i.e., apertures) in film layers, typically dielectric film layers, to create pathways, typically conductive pathways, through the film layer. Traditionally, the aperture filling has been provided by depositing a filling material layer over a previously deposited film layer, typically a dielectric film layer, having apertures therethrough. For example, a contact is created through a dielectric layer by depositing a conductor, such as aluminum, into an aperture in the dielectric layer. Where the material used to fill the aperture might be reactive with the materials over which it is deposited, such as where the filing material may interdiffuse with the material at the base of the aperture and result in a material having undesirable qualities, a barrier layer must be deposited in the aperture to line the aperture before the filling material is deposited. After the barrier layer is deposited, a conductive material is deposited thereover to form the contact. To enable further processing of the wafer, the conductive material used to fill the aperture must be planarized to reduce any significant variation in the height of the exposed portion of the film layer, which variation is a consequence of depositing a relatively uniform thickness filling material layer over a surface filled with the apertures.

Physical vapor deposition, or "PVD", is one known method of filling apertures useful in semiconductor device fabrication. In PVD, a target of the deposition material is exposed to a plasma and sputtered by ions from the plasma. The material sputtered from the target is deposited on a substrate. The deposited material forms a film layer on the substrate and is also used to fill the apertures. To provide a planarized deposited film layer, and to ensure the filling of the apertures, the film layer may be deposited at elevated temperatures to cause the conductive material to "reflow", thereby filling the apertures and creating a "planarized" layer, i.e., one having a relatively flat upper surface. Typically the reflow step is performed at substrate temperatures on the order of 480° C. or above.

The filling of apertures using traditional sputtering methods has become difficult as the aperture aspect ratio has increased. Where the hole width equals the hole depth, i.e., at a 1:1 aspect ratio, traditional sputter deposition techniques may ensure conformal deposition of the target material on the sides and base of the hole and enable complete filling of the aperture. However, there is still a need, even with apertures having an aspect ratio of 1:1, to provide aperture filling at lower reflow temperatures. At higher aspect ratios, nominally at aspect ratios above about 2:1, the utility of traditional sputtering techniques for aperture filling is questionable. The reason is substantially a result of aperture and sputter geometries. Because the target particles sputtered from the target travel in linear paths, the base and lower portion of the walls of the aperture are blocked from those sputtered particles which are traveling transversely to the surface of the substrate. The deposit formed by the sputtered particles in high aspect ratio apertures tends to be very thick at the aperture opening and very thin at the base of the aperture. As the deposition of the sputtered particles continues, the material which is deposited at the opening of the aperture continues to build up during continued deposition. This deposit will increasingly block the target material from the base of the aperture wall. Eventually, the layer formed at the opening of the aperture can completely cover the aperture, preventing further deposition of the deposition material into the aperture. Therefore, to fill high aspect ratio apertures by sputter deposition, alternative methods must be used.

One alternative approach to sputtering which may be used to fill high aspect ratio apertures is coherent deposition, wherein a collimated supply of target material is deposited over the surfaces of the substrate at a low temperature, typically below 150° C. to form a "seed" layer of material on the substrate. After the seed layer is formed, the substrate is moved to a second, non-coherent, sputtering chamber and the aperture is filled with a sputtered material which is deposited on the substrate while the substrate is maintained at a temperature of about 480° C. or above. This high temperature causes the material being deposited on the substrate to reflow and thereby: 1) Fill the aperture; and, 2) result in a planarized film layer. The time required to fill the apertures and planarize the deposited film layer by the reflow technique is a function of the substrate temperature. The higher the substrate temperature, the faster the apertures are filled and the film layer planarized. However, if the substrate is too hot, the seed layer will coalesce into individual droplets and prevent the formation of a conformal film layer, or, previously deposited materials will change dimension or be thermally degraded. Where reflow techniques are used to fill apertures having a depth of $1.2\mu$ and an aspect ratio of approximately 1:1, and aluminum is being deposited as the aperture filling material, a substrate temperature of about 480° C. can result in filled apertures and a planarized deposition layer in about three or four minutes. For 0.5 micron wide or smaller apertures, i.e., standard $1.2\mu$ deep apertures having aspect ratios of approximately 2:1 or higher, the reflow method has limited effectiveness. In particular, even using coherent deposition, higher aspect ratio holes may take too long to fill at an acceptable reflow temperature. Additionally, the collimator screens a substantial quantity of the deposition material and thereby reduces yield and throughput.

One additional known method of filling high aspect ratio apertures is to ionize at least a portion of the deposition material sputtered from the target and attract the ionized target material to the substrate. By ionizing the deposition material and electrically attracting it to the substrate, the deposition material reaching the substrate will be travelling perpendicular to the substrate. Thus, the deposition material will reach the base of the apertures and will not tend to collect on the upper reaches of the aperture wall.

For example, U.S. Pat. No. 5,178,739 to Bariies et al., issued Jan. 12, 1993 describes a sputter deposition system which includes a hollow, cylindrical sputter target disposed between an end sputter target and a substrate, all of which are contained in a vacuum chamber. A plurality of magnets arc disposed outside the chamber to create intense plasma regions near the interior surface of the cylindrical target and thereby cause ionization of at least a portion of the material sputtered from the target. RF power is inductively coupled into the chamber through an interior rf coil located between the target and the substrate to sustain the plasma. The substrate is electrically biased to control the directionality and energy of the ionized sputtered material. The ions produced using the sputter deposition system are said to have low angular divergence after crossing the plasma sheath and therefore are said to be capable of uniformly filling high aspect ratio apertures such as holes. (A high aspect ratio hole is typically described as being a hole (via) having a height to width ratio of 1:1 or greater).

Although ionized deposition is a known way of filling high aspect ratio holes, the technique is significantly more expensive than traditional sputtering techniques because the deposition rate is slower, the power requirements are greater and the equipment is more expensive than traditional sputtering equipment. Notwithstanding these limitations, it is believed is by those skilled in the art that the filling of very high aspect ratio holes, i.e., those above approximately 2:1, may only be accomplished using ionized deposition material, and that other techniques, such as coherent deposition followed by traditional sputter deposition and reflow cannot meet the needs of device fabricators as line widths continue to shrink.

An objective of the present invention is to provide a means which enables a conductive material, typically a metal or metal alloy, to fill a narrow, high aspect ratio, aperture without the formation of voids in the resulting deposit to provide a suitable integrated circuit electrical contact. The deposition of the metal or metal alloy is preferably carried out at substrate temperatures below 480° C., so that the thermal budget for the process is low. Even more preferably, the sputtering of the metal or metal alloy is carried out at substrate temperatures below as little as about 350° C. to reduce the initial and maintenance costs of the heating element used provide the substrate temperatures as well as the thermal budget for the process. These lower temperatures may also enable use of materials in IC fabrication which have lower thermal breakdown or creep temperatures but are useful to circuit designers, because deposition materials deposited on the substrate before the metal or metal alloy deposition step will experience lower processing temperatures than those of the prior art when the methods of the present invention are employed to provide filled apertures and a planarized film layer.

SUMMARY OF THE INVENTION

The present invention provides methods, apparatus and structures useful for integrated circuit device fabrication. In one aspect, the invention provides a contact in an aperture extending through a film layer or into a substrate itself. In another aspect, the invention pertains to a coating layer which enables the filling and planarization of apertures to form integrated circuit electrical contacts having widths as small as 1000 Å and aspect ratios ranging between about 1:1 and about 12:1. In a further aspect the coating layer is a barrier layer which prevents inter-diffusion between a material forming the base or side of the aperture and the material ultimately used to fill the aperture. In particular, a barrier layer created by the present invention enables the filling, without significant voids, of apertures with a conductive material, such as aluminum, wherein the substrate temperature is maintained at a temperature below as little as 350° C. during reflow. Preferred conductive materials for filling the electrical contacts arc metals and metal alloys. The most preferred metals and metal alloys include, by way of example and not by way of limitation, aluminum and alloys of aluminum such as aluminum-copper, aluminum-copper-silicon, aluminum-silicon, aluminum-germanium, aluminum-palladium-silicon and other conductive materials having a similar reflow temperature range, i.e., a similar range of temperatures within which the material will flow to provide a planarized film layer. Further, it is contemplated that other materials having higher reflow temperatures, including without limitation copper and copper alloys, may be used to fill the aperture using the techniques of the present invention. Where the carrier layer of the present invention is used, the step of simultaneously sputtering and reflowing a conductive material to provide filled apertures and a planarized film layer may be carried out at the relatively low, as compared to the prior art, substrate temperatures of below about 450° C., more preferably at temperatures below about 430° C., and most preferably at temperatures in the range of about 350° C. to 400° C. Where aluminum is the conductive material being used to fill the hole, substrate reflow temperatures as low as 300° C. are envisioned.

In one aspect, the carrier layer may be characterized as one formed by the method of sputter deposition, wherein at least a portion of the material sputtered from the target is ionized and reacted with a second material before it reaches the substrate. In the most preferred aspect, the gas used to form the sputtering plasma is reactive with the material sputtered off the target, such that the carrier layer is formed, at least in part, by a compound comprising target and gas atoms.

In still another aspect, the carrier layer may be characterized as a smooth layer having a surface roughness of less than approximately 15 Å rms.

In a still further aspect, the carrier layer can be characterized as enabling the flow of a layer of material deposited thereon thereover.

In still another aspect, the invention is an apparatus for providing a contact in an aperture, wherein a first chamber is provided for creating a carrier layer on the sidewalls of the aperture, and an additional chamber is provided for deposition of a material over the carrier layer. In one configuration, the first chamber is a sputter chamber which includes a means for ionizing at least a portion of the material leaving the target before it reaches the substrate, to ensure that at least a portion of the material forming the carrier layer is deposited in an ionized state.

BRIEF DESCRIPTION OF THE DRAWINGS

FIG. 1 illustrates a schematic of a conductive contact 118 formed within a high aspect ratio via 113 using the method and apparatuses of the present invention;

FIG. 2 shows a schlematic of sputtering equipment 200 useful for practicing the inventions.

DETAILED DESCRIPTION OF THE PREFERRED EMBODIMENTS

I. DEFINITIONS

Figure 3:
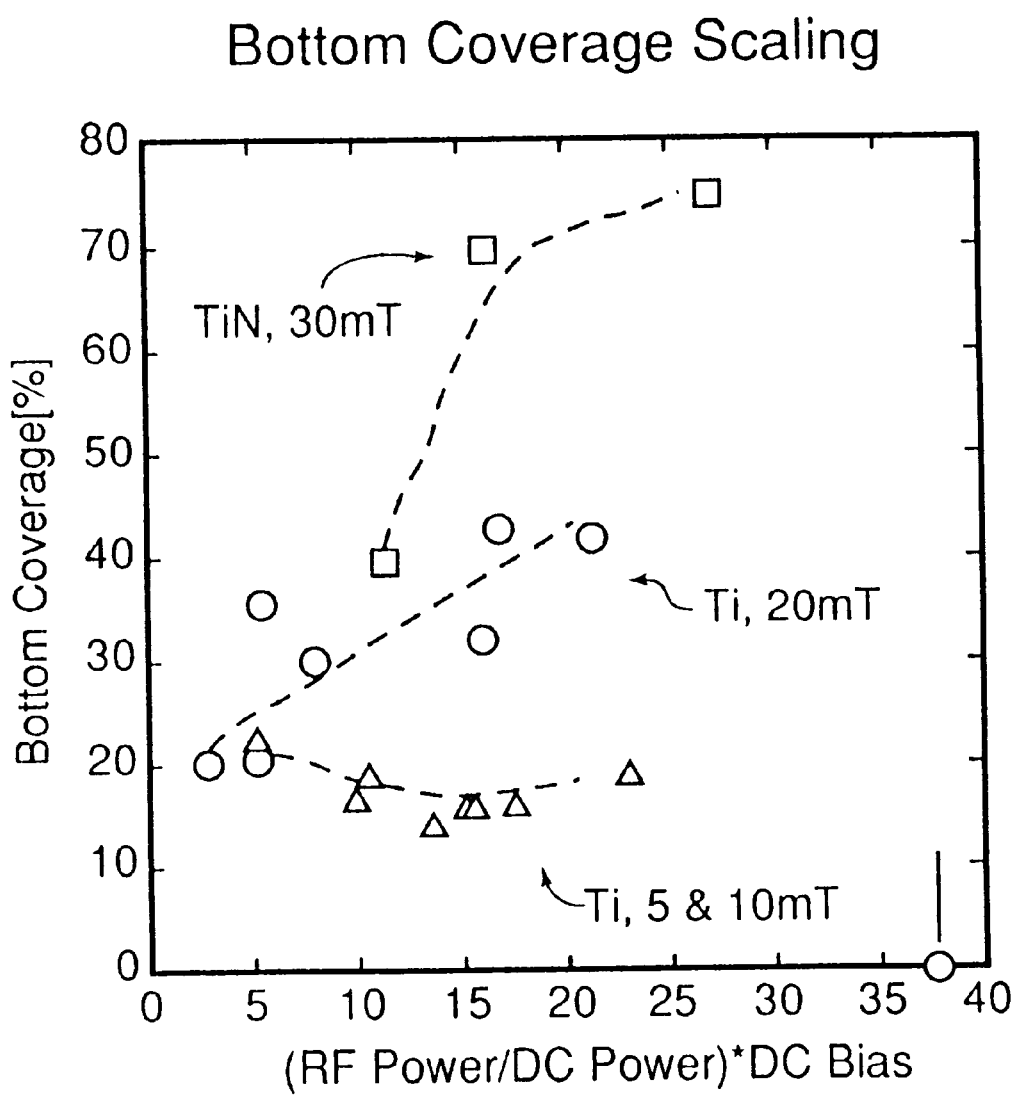
FIG. 3 graphically illustrates the percentage of bottom coverage of a via of the kind shown in FIG. 1. Percent bottom coverage as used herein refers to the thickness of the layer deposited on the bottom surface of the via as a % of the thickness of the layer deposited on the upper, top surface of the via. The per cent bottom coverage is shown as a function of sputtering chamber pressure and as a function of the ratio of rf power (216 in FIG. 2) to DC power (213 in FIG. 2) times the DC bias (222 in FIG. 2).

As a preface to the detailed description, it should be noted that, as used in this specification aid the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an rf glow discharge, reference to "the contact material" includes aluminum, aluminum alloys, and other conductive materials which have a inciting point enabling them to be sputtered over the temperature range described herein.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example.

The term "aspect ratio" refers to the ratio of the height dimension to the largest width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the width of the trench at the trench opening.

The term "traditional sputtering" refers to a method of forming a film layer oil a substrate wherein a target is sputtered and the material sputtered from the target passes between the target and the substrate to form the film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

II. INTRODUCTION TO THE EMBODIMENTS

In accordance with the present invention, it has been discovered that it is possible to use traditional, i.e., non-ionized, non-coherent, sputter deposition techniques, to deposit conductors, in particular aluminum (and aluminum alloys), into an aperture (such as a trench, via or through hole) in a film layer or substrate, wherein the aperture has an aspect ratio of 1:1 or greater and wherein the deposition of the conductor is conducted at reflow temperatures substantially below traditional prior art reflow temperatures (of the substrate) on the order of 480° C. or more to form a contact or via in the aperture. This is enabled by forming a carrier layer on the walls of the high aspect ratio aperture before the conductor is deposited. Applicants have learned that this carrier layer enhances the flow or migration of the deposition material used to fill the aperture, thereby enabling the filling of apertures using traditional sputter and reflow techniques in apertures which could not be filled in reasonable periods of time using prior art sputter and reflow techniques. In fact, this has been accomplished in apertures only $0.25\mu$ wide ($0.15\mu$ at the base) having an aspect ratio of approximately 5.0 at a substrate reflow temperature of 390° C. for a period of four minutes, which was not heretofore considered practicable using conventional sputtering techniques. In particular, the invention has enabled sputter deposition of aluminum over a carrier layer to form contacts in high aspect ratio holes and thereby create contacts in apertures which were deemed impractical or impossible to fill using traditional sputtering techniques, or which were believed to only be fillable where the flux of sputtered conductive material was ionized and then electrically attracted to the substrate. The invention includes the contact formed in the high aspect ratio aperture as is enabled by the carrier layer, the process of forming the contact, including the process of forming the carrier layer, and the apparatus used to create the contact and carrier layer.

III. THE EMBODIMENTS

The present invention employs a novel apparatus and novel method to provide a contact, via or other structure in an aperture in a film layer. The method and apparatus may be used to provide the contact, via or other similar structure in a high aspect ratio hole without the need for collimators and without the need to provide the aperture filling material (typically a conductor) in an ionized form. The methods and apparatus also provide a carrier layer which is deposited on the side wall of the aperture with a filling material deposited thereover. In one specific embodiment, the carrier layer is deposited using ionized deposition techniques wherein a material is sputtered from the target and ionized, at least in part (10 to 100% ionization), before it is deposited on the substrate. Preferably, a portion of the carrier layer is composed of non-reacted target material and the remainder of the carrier layer is composed of target material which has been reacted with a gas before being deposited on the substrate. Applicants have discovered that the carrier layer facilitates the filling of high aspect ratio holes at lower reflow temperatures than those used in the prior art, and without the need for a collimated seed layer.

A. A Representative Aperture

As an illustration of an aperture such as a via, trench or hole to be filled using the techniques described herein to form a contact, FIG. 1 shows a schematic of an aperture 113 containing the carrier layer 100. The example aperture 113 of the Figure was formed through a silicon dioxide film layer 111 overlying a silicon base 110. The aperture 113 was created by dry etching through the silicon dioxide layer 111 to silicon base 110.

B. The Contact of the Present Invention

Referring initially to FIG. 1, there is shown therein an exemplary contact 118 formed in a high aspect ratio aperture 113, specifically an aperture 113 having an aspect ratio of about 5:1 (0.25µ wide by 1.2µ deep). The contact includes at least two sub-elements: A carrier layer 100; and a conductive material 117 which has been deposited over the carrier layer 100 to fill the volume of the aperture 113 remaining after the carrier layer 100 has been deposited. In an embodiment of the contact described herein, the carrier layer is formed by sputtering a material from the target and depositing it on a substrate, reacting a portion of the sputtered material with a gas maintained in the space between the target and the substrate before it deposits on the substrate, and also ionizing at least a portion of the material sputtered from the target before it is deposited on the substrate. The conductive material of the exemplary contact was provided by traditional sputtering of a target composed of the conductive material to deposit a seed layer over the carrier layer at a low temperature then continuing deposition of the conductive material in the same chamber while a simultaneous reflow step is performed by heating the substrate to a temperature of 390° C. for four minutes.

In the specific embodiment of the contact 118 shown in FIG. 1, aluminum is used as a conductive material 117 which is deposited over the carrier layer 100 using traditional sputtering techniques. To form a contact 118 the aperture 113 extends to a region of the underlying substrate, 110 and it includes an exposed portion 120 of the silicon substrate 110 at the base 111 thereof. To prevent interdiffusion between the silicon and the aluminum, the carrier layer 100 also functions as a barrier layer. In this embodiment of the contact, 118 the barrier layer 100 is formed of three sub-layers, which may, if desired, be formed in a single chamber. The first sub-layer 112 is a sub-layer of titanium which was sputtered from a target and partially ionized (10 to <100% ionization) before being deposited upon the surface of both silicon dioxide layer 111 and silicon base 110; the second sub-layer 114 is a layer of sputtered titanium which is partially ionized and reacted with nitrogen to form titanium nitride before it is deposited over first sub-layer 112; and the third sub-layer 116 is a layer composed of both sputtered titanium and titanium nitride deposited in a partially ionized state (10 to <100% ionization). After depositing the titanium layer 112, a thin layer of titanium silicide 124 may be formed at the bottom of via (aperture) 113 by high temperature annealing to provide the barrier layer between the conductor and the underlying substrate. However, it has been found that the carrier layer of the present invention will function as a barrier layer without the need to anneal the carrier layer to form the titanium silicide.

The carrier layer, once deposited, provides a conformial layer having a thickness of approximately 800 Å, leaving an interior volume 119 within the aperture 113 to be filled with the conductive material. The remaining volume 119 of the contact 118 is then filled by traditional, i.e. non-ionized, sputtered aluminum (or aluminum alloy) deposition with a reflow step performed at a relatively low substrate temperature on the order of 390° C. for 2 minutes to 350° C. for 10 minutes. Contrary to the suggestion in the prior art that very high aspect ratio apertures can only be filled by ionized deposition of a sputtered source of a conductor, applicants have discovered that by using the carrier layer as described herein, the aperture fill material can be deposited using traditional sputter techniques and flowed into a high aspect ratio aperture to create contacts, vias, etc. Therefore, by employing the carrier layer hereof, a layer of conventionally sputtered aluminum may be used to fill the remaining volume of an aperture to create a contact. This is preferred, since the equipment required for ionized deposition of sputtered aluminum is much more expensive than that required for standard, or traditional, deposition of sputtered materials. Further, the carrier or barrier layer enables deposition of a conventionally sputtered layer of aluminum into the aperture at reflow temperatures substantially below those of the prior art.

C. The Carrier Layer of the Present Invention

1. One Embodiment of the Carrier Layer

The carrier layer of the present invention may be used as a barrier layer, as is described above with respect to a contact, or it may be used to facilitate the filling of high aspect ratio apertures with a filling material such as a conductor where a barrier layer is unnecessary. In either case, the carrier layer enables filling of apertures having high aspect ratios with a filling material in a reflow process at lower temperatures and/or with faster filling and planarization times as compared to the prior art. The carrier layer may be characterized in several ways. It is believed that a carrier layer meeting the characteristics of any of the characterizations will enable the filling of high aspect ratio apertures at lower temperatures and faster reflow times as compared to the prior art. In one characterization, the carrier layer is a smooth layer, i.e., a layer having an exposed surface which has a low surface roughness as compared to the prior art. One such smooth layer is comprised of a densely packed columnar barrier layer material structure, wherein the columns are disposed substantially perpendicular to the aperture wall. In another characterization, the carrier layer has a wetting effect, i.e., it enhances the flow of materials thereover, specific materials including aluminum and alloys thereof In a still further characterization, the carrier layer is one formed by the deposition of a material onto the walls and base of the aperture by the process of ionized, partially reactive, deposition of sputtered particles, i.e., where the material being sputtered from the target is ionized at least in part, and partially reacted with a gas, and the ionized partially reacted material is directed toward the substrate, such as by the maintenance of an electric field on the substrate support.

One embodiment of the carrier layer structure of the present invention for lining apertures such as vias, trenches, and through holes is achieved by depositing a layer of an ionized, sputtered, refractory metal on the substrate; followed by ionized deposition of a sputtered refractory metal in a reactive atmosphere to deposit a second layer of a refractory metal compound on the substrate; followed by the deposition of a layer composed partially of ionized refractory metal which has been reacted with a gas to form a refractory metal compound and partially by an ionized refractory metal to form a third layer on the substrate. The third layer may contain a percentage of refractory metal compound formed by maintaining a gas reactive with the sputtered refractory metal in the region between the target and the substrate as the target is sputtered; preferably, the highest concentration of refractory metal compound formed in the third layer is adjacent the second layer, with increasing concentration of the refractory metal (less concentration of the compound) toward the outer surface of the third layer. One known method of providing this composition of the third layer is to maintain the chamber at a poisoned mode, i.e., where the quantity of reactive gas exceeds the quantity needed to ensure complete reaction between the sputtered material and the gas, and shutting off the reactive gas supply while maintaining the supply of argon (or other non-reactive species) to allow sputtering to continue. The remaining reactive gas will react with the sputtered material, such that the available quantity of reactive gas will decrease as it is used to form the compound. Preferably, the power supporting the gas in a plasma state is switched off before all of the reactive gas is reacted, thereby ensuring that the outermost surface of the carrier layer includes both the sputtered material in pure form and the compound composed of the sputtered material and the reactive gas. Once the carrier layer has been deposited an electrical contact, or metallized layer in general, can be obtained by sputtering of a conductive material such as aluminum from a target and depositing it over the third layer of the smooth barrier layer structure using traditional sputtering and reflow techniques. In the embodiment of the carrier layer 100 of FIG. 1, the carrier layer 100 is comprised of three layers: Ti112/TiN114/TiN$_x$116. Applicants also believe that other refractory metals and refractory metal compounds, including without limitation TaN and Ta, will provide the advantages of the invention. Additionally, although the preferred implementation of the invention contemplates that the carrier layer includes multiple sub-layers where each sub-layer is composed of the same metal base, i.e., Ti is the base metal in the Ti/TiN/TiN$_x$ layer, applicants believe that the individual layers of a multi-level carrier layer could be composed of different materials as the base metal in each layer. One primary advantage of using a single base metal, such as Ti, to form the multi-layered carrier layer is that the entire carrier layer can be deposited in a single chamber in a continuous process.

Although the carrier or barrier layer 100 of the example contact 118 is provided with three different sub-layers, applicants believe that just the outermost layer, in the specific example the TiN$_x$ layer formed of Ti and TiN, (the $_x$ reflecting the percentage of TiN, by weight, in the layer), or just a TiN layer, will provide the enhanced aperture filling characteristics of the present invention.

2. Characterization of the Carrier Layer.

Applicants have found that one characteristic of the carrier layer is its microstructure. The microstructure of the refractory metal or metal compound formed using standard reactive sputtering techniques would not permit sputtered aluminum undergoing a reflow operation to easily flow into a high aspect ratio aperture and thereby fill it. This appears to be due to the surface topography and lack of wettability of the traditionally sputtered refractory metal compound. However, one characteristic of the carrier layer of the present invention is a relatively smooth surface, approximately one-third the rms surface roughness (about 15 Å) of a prior art, traditionally sputtered, barrier layer (about 40–50 Å rms). It has been found by applicants that this smoother layer enables filling of high aspect ratio holes at lower temperatures and within the time constraints of integrated circuit manufacturers, i.e., approximately five minutes, as compared with prior art traditionally sputtered barrier layers. In fact, the carrier layer of the present invention has enabled the filling of apertures with an aluminum conductor, wherein the aperture has an aspect ratio of 5:1 and a width of approximately 2500 Angstroms, which is not possible in a reasonable period of time following prior art techniques. When aluminum was sputter deposited into an aperture having these characteristics using traditional sputtering techniques, the sputtered aluminum was full of unacceptable voids. Attempts to reflow the aluminum to eliminate the voids were unsuccessful, even at elevated temperatures.

Another characteristic of the carrier layer is that of a plurality of densely packed crystalline or granular deposits of deposition material, having a generally longitudinal grain structure whose orientation is perpendicular to the aperture wall. In the prior art structure, where the carrier layer is deposited using traditional sputter techniques, similar grain or crystalline structures are formed, but their orientation is not perpendicular to the aperture wall, and the end faces face upward creating a series of saw tooth edges. It is believed that these edges inhibit flow of the conductor down the wall of the aperture in the prior art.

A still further characteristic of the carrier layer is that it forms a wetting layer which enhances the flow of the conductive material therepast. Specifically, applicants believe that the layer enhances the flow of the conductive material therepast to enable void free filling of the aperture.

Each of these characteristics is provided by the formation of the three layer Ti/TiN/TiNx layer using ionized deposition techniques as described herein.

D. The Method

The contact structure of the present invention is created within an aperture such as a via, through hole, or trench, by first depositing a carrier layer over the walls and base of the aperture and then filling the aperture by depositing the filling material using traditional sputter techniquse and reflowing the material to fill the aperture. The carrier layer which is used to line the aperture is provided by ionized deposition, preferably by ionizing a flux of sputtered material. The carrier layer is preferably comprised of at least one layer of a ionized sputtered refractory metal which is partially reacted with a gas to form a film layer comprised of refractory metal and refractory metal compound in a thin layer (100 Å or less). For purposes of discussion, and not by way of limitation, the invention will be described herein in terms of titanium as the refractory metal and titanium nitride as refractory metal compound. In one embodiment the structure is a three-layer structure of the kind shown in FIG. 1 and described above.

As previously described, it has been discovered that the deposition of ionized sputtered titanium, wherein a portion of the sputtered ionized titanium is reacted with nitrogen, to form a carrier layer produces a surface within an aperture having a smoother surface with respect to prior art barrier layers which permits subsequently sputtered aluminum to wet the surface of the barrier layer and flow over that surface. In fact, surprisingly, the aluminum flows in a manner such that the aluminum continues to slip over the sidewall surfaces, gradually filling any voids which were initially trapped within the sputtered aluminum, at temperatures significantly below prior art reflow temperatures. Although applicants consider that the TiN$_x$ layer or a TiN layer alone will supply the reflow and filling enhancements described herein, applicants consider the most preferred carrier layer to be comprised of a base layer of Ti, an overlying layer of TiN, and a final layer of TiNx.

Figure 5:
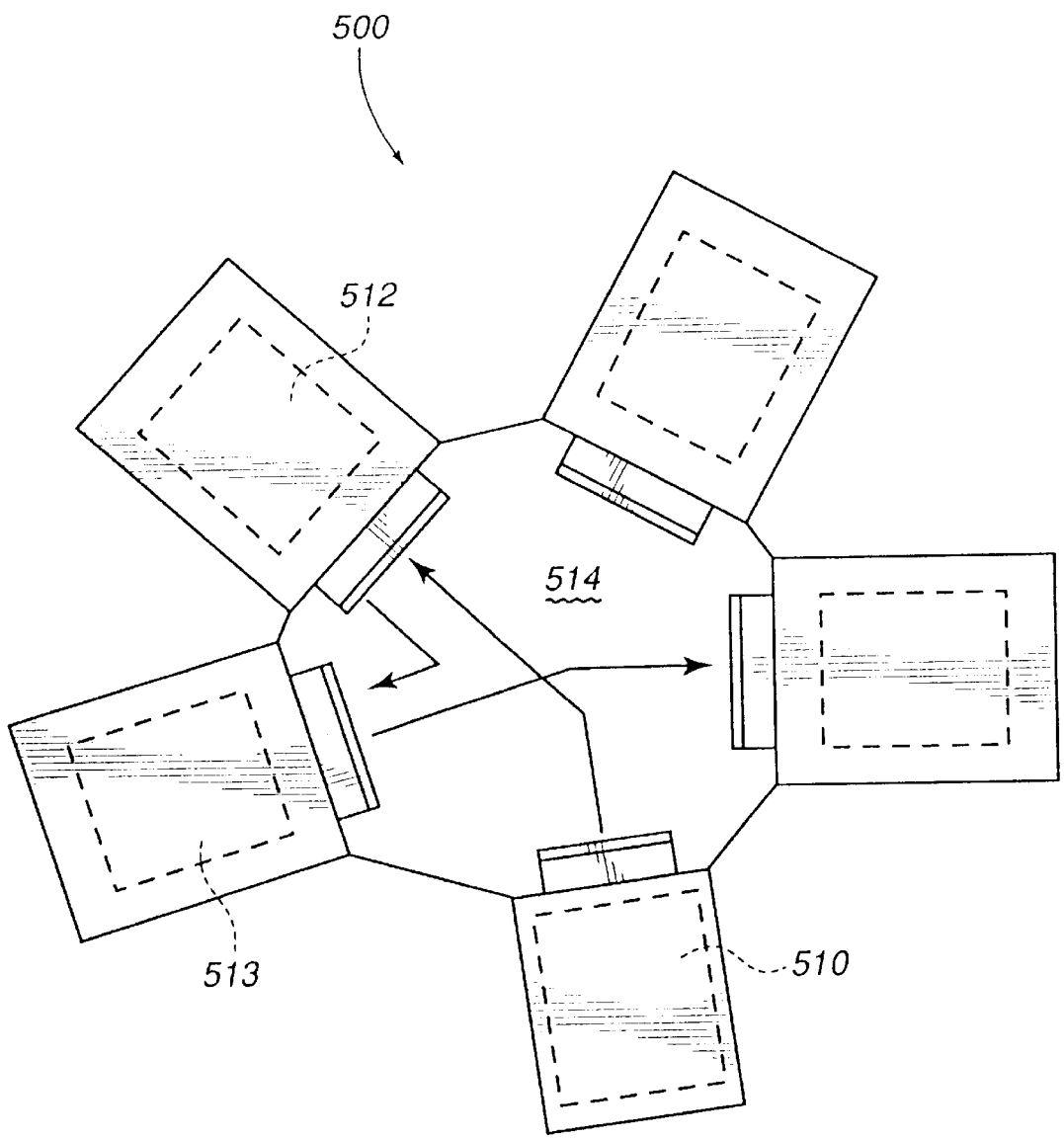
FIG. 5 depicts a schematic of a multi-chamber low pressure processing system having individual low pressure processing chambers within the system. A workpiece comprising a substrate on which an integrated circuit device is being formed can be moved from one individual chamber to another using robots (not shown) while remaining contained within the low pressure environment.

The above described methods are particularly well carried out in a low-pressure processing system 500 of the kind shown in FIG. 5. Application of the smooth barrier layer structure can be carried out in one individual low pressure chamber 510 (having the construction shown in FIG. 2), while aluminum sputtering is carried out in another individual low pressure chamber 512 (having a similar construction as the chamber shown in FIG. 2, less the coil 214; with closer target to substrate, spacing, and with means for heating the substrate such as an electric heater in contact with the substrate support, with a gas maintained between the substrate and the support member): Subsequent processing is carried out in yet another individual low pressure chamber 513. One embodiment of a support member with heater and gas flow arrangement for practicing the invention is disclosed in U.S. Pat. No. 5,228,501, fully incorporated herein by reference. A center low pressure chamber 514 connects the individual low pressure chambers, and a robot (not shown) is used to transfer workpieces from one individual low pressure chamber to another.

One method for fabricating the carrier layer of the invention, includes the steps of a providing a flux of sputtered material, ionizing the sputtered material, reacting a portion of the flux of sputtered material with a gas to form a compound before it is deposited on the substrate, maintaining a bias on the substrate, support member to attract ions to the substrate to simultaneously deposit the sputtered material and the compound on the substrate, and then depositing a fill material on the substrate and reflowing the fill material to fill the aperture. Preferably, the fill material is deposited in two steps: A seed layer of the fill material is deposited at a temperature below approximately 150° C., and the remainder of the fill material is deposited while the substrate is being heated to, and then maintained at, an elevated "reflow" temperature. The deposition of the carrier layer is performed in a first chamber, and the deposition of the filling material is performed in an additional, second chamber.

To provide the three layer structure of carrier layer 100 as shown in FIG. 1, all three layers are preferably deposited in a single chamber in a continuous process. This may be accomplished, in the case of a titanium based carrier layer 100, by following the steps of sputtering a titanium target, ionizing at least a portion of the titanium (10% to 100%) before it is deposited on the substrate, attracting the ionized target material to the substrate and forming the first sub-layer therewith; then introducing a sufficient quantity of a reactive gas, preferably nitrogen, into the chamber as sputtering and ionization continues and thereby causing all of the material sputtered from the target to react with the gas to form a compound film layer of TiN on the substrate; and, then stopping the flow of reactive gas to the chamber while still sputtering the target and ionizing the sputtered target material to form a film layer on the substrate composed of both the base target material, preferably Ti and a reacted product, preferably TiN. Once the Ti/TiN sub-layer (hereinafter TiNx) has been formed to a sufficient thickness, the power to the system is shut off to stop the sputtering process.

After a carrier layer of the appropriate composition and thickness is deposited on the substrate, the substrate is moved to a traditional sputtering chamber, where a filling material is deposited over the carrier layer using traditional sputter deposition and reflow techniques, but the formation of the seed layer at low temperature followed by reflow at high temperature may be performed in a single chamber.

E. An Apparatus for Practicing the Invention

A process system in which the method of the present invention may be carried out is the Applied Materials (Santa Clara, Calif.) 5500 Integrated Processing System. This process system is not specifically shown in the Figures, however, the processing elements shiown in FIG. 2 can be operated within one of the low pressure process chambers contained within such an Integrated Processing System. The system is also shown and described in U.S. Pat. Nos. 5,186,718 and 5,236,868, the disclosures of which are incorporated by reference. With reference to FIG. 2, one low pressure process chamber for forming the smooth barrier layer of the present invention employs a standard sputter magnet 210 (to confine the sputtering plasma, enabling an increased sputtering rate) and a sputtering target cathode 212 which operates at power levels up to about 24 kW. To form the specific, Ti based carrier layer, a titanium target cathode was 14 inches (35.5 cm) in diameter and DC power was applied to this cathode over a range from about 3 kW to about 5 kW. The substrate 218, comprising an 8 inch (20.3 cm) diameter silicon wafer, was placed a distance of about 5 inches (12.7 cm) from target cathode 212. A high density, inductively coupled rf plasma was generated in the region between the target cathode 212 and the substrate 218 by applying rf power 216 over a range from about 1 MHz to about 13.6 MHz to a multiple turn coil 214 (preferably more than 4 turns) of water cooled 0.125 inch (0.32 cm) diameter metallic tubing surrounding a plasma region between the target 212 and substrate 218. A lower frequency bias, on the order of 50 to 800 kHz, is applied to the substrate 218 or the support member. A resulting D.C. self bias attracts ions from the plasma to the substrate.

Although the preferred apparatus for forming the carrier layer uses a coil to inductively couple the plasma and ionize the sputtered material, other means for ionizing the material are contemplated. For example, an ECR source, such as that shown and described in U.S. Pat. No. 4,911,814 incorporated herein by reference, or a helicon type coupling device such as that shown in U.S. Pat. No. 4,990,229, incorporated herein by reference, are also specifically contemplated. Likewise, other apparatus which would supply an ionized stream of deposition particles having an ionized percentage of 10 to 100% are contemplated as being useful to practice the inventions.

IV. EXAMPLES

A. Example A

To obtain a deposition rate of an ionized, partially background gas reacted, titanium nitride/titanium layer of about 300 Å per minute upon the surface of an 8 inch (20.3 cm) diameter substrate, 1.5 KW of rf power at 2 MHz was applied to coil 214 while 5 KW of DC power was applied to titanium target cathode 212, and an AC bias of 90 Watts at 350 kHz was applied to substrate platen electrode 220, resulting in a D.C. self-bias of 70 V. The sputtering and ionization of the sputtered material was carried out in a process chamber with the chamber pressure ranging from about 20 mT to about 30 mT. To obtain the 300 Å per minute deposition rate, the sputtering and ionization of the sputtered material was carried out at about 30 mT. This pressure corresponded to an argon feed rate of about 10 sccm and a nitrogen feed rate of about 70 sccm in the Applied Materials 5500 Integrated Process System. The temperature of the substrate in the process chamber was about 50° C.

B. Example B

To obtain a deposition rate of about 1200 Å per minute of ionized titanlium upon the surface 218 of an 8 inch (20.3 cm) diameter substrate, 1.5 KW of rf power at 2 MHz was applied to coil 214 while 5 KW of DC power was applied to titanium target cathode 212, and a low frequency bias of 120 Watts at 350 kHz was applied to substrate platen electrode 220 resulting in a D.C. self bias of 45 V. The sputtering and ionization was carried out in a process chamber over a chamber pressure ranging from about 20 mT to about 30 mT argon. To obtain the 1200 Å per minute deposition rate, the sputtering and ionization was carried out at about 20 mT. This pressure corresponded to an argon feed rate of about 45 sccm in the Applied Materials 5500 Integrated Process System. The temperature of the substrate in the process chamber was about 50° C.

V. STEP COVERAGE OF THE CARRIER LAYER

FIG. 3 shows the % of bottom coverage achieved for ion-deposition sputtered titanium and titanium nitride as a function of power applied and the process chamber pressure. Percent bottom coverage refers to the thickness of the ionized sputtered deposition of titanium or resulting titanium nitride at the bottom of a through hole as a percentage of the thickness of the material deposited on the upper surface of the substrate surrounding the through hole. Thus, if the bottom coverage is 50%, the thickness of the layer at the bottom of the through hole is 50% of the layer thickness on the upper surface of the substrate. The bottom coverage obtained using ionized deposition of sputtered particles has been demonstrated to be more than tell times greater than that achieved using standard sputtering techniques. This marked increase in bottom coverage has been accompanied by a surprising increase in the smoothness of the walls of the through hole, enabling the subsequently applied aluminum to flow with unexpected ease over the walls to provide rapid filling of the hole without the presence of void areas in the final contact structure.

The data presented in FIG. 3 is for a through hole having a $0.25\mu$ diameter at the bottom of the through hole and an aspect ratio of about 5:1 (5.0). The applied power function was calculated as the ratio of induction coil RF power to target cathode DC power, with the ratio multiplied by the support electrode DC bias.

VI. PROCESS WINDOW FOR 0.25 MICRON APERTURES

Figure 4:
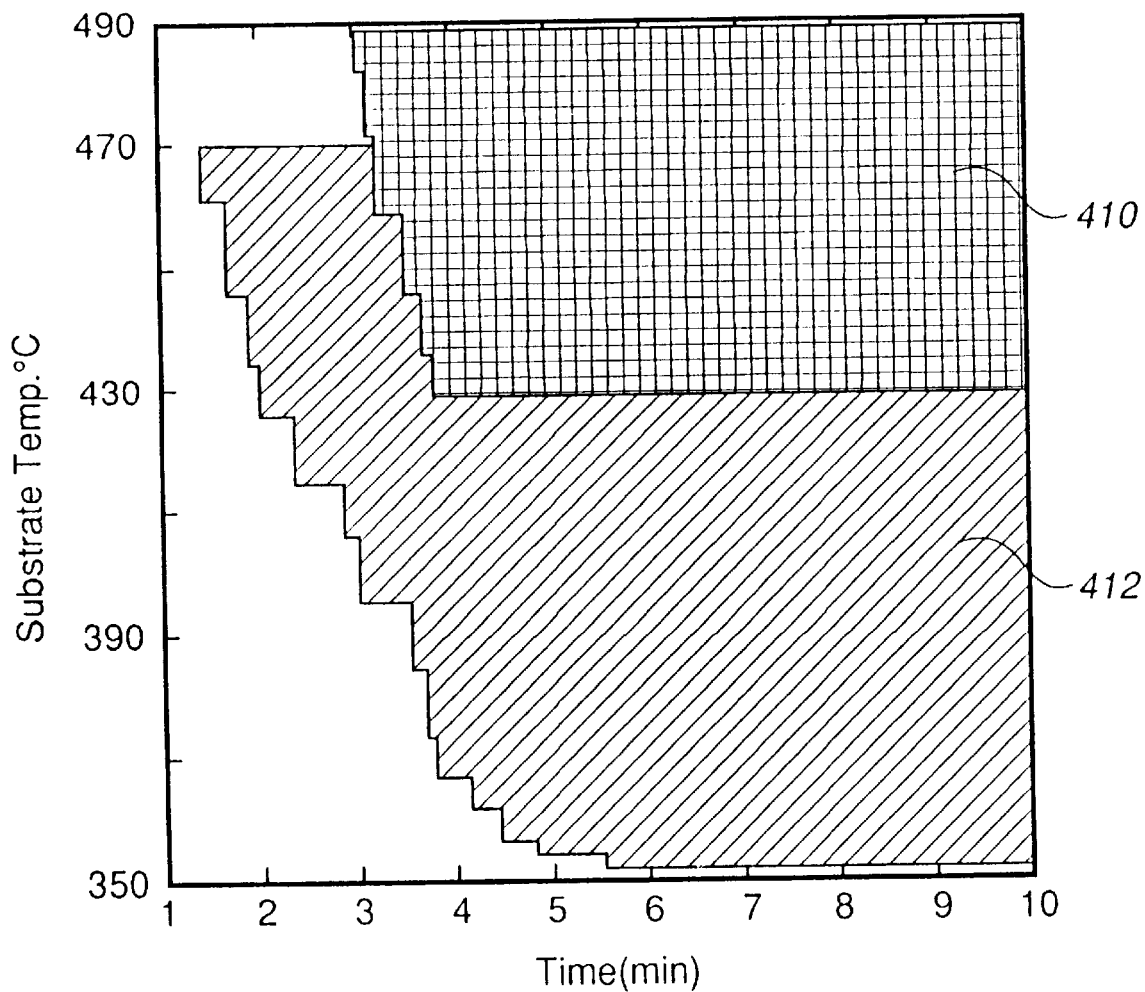
FIG. 4 graphically shows the range of time and temperature conditions for sputtering deposition of aluminum which provides aluminum filling of $0.25\mu$ through holes having an aspect ratio of about 5, when the through holes have been lined with a three-layer most preferred embodiment carrier layer structure (Ti/TiN/TiN$_x$) of the present invention.

FIG. 4 shows the time temperature conditions for aluminum sputtering which provide aluminum filling of $0.25\mu$ diameter through holes having an aspect ratio of about 5. The through holes were prepared by dry etching a silicon dioxide layer approximately $1.2\mu$ thick which had been deposited over a silicon wafer substrate. The three-layered Ti/TiN/Ti$_x$ ionized sputtered material structure of the present invention was then applied over the through holes (including the underlying silicon substrate).

The through holes represented in FIG. 4 were lined with a first layer of ionized sputtered titanium deposited about 200 Å thick which was applied over the surface of the substrate comprising through holes. Typically, the thickness of the titanium layer at the bottom of the hole was about 140 Å, about 70% of the 200 Å thick deposit on the upper surface of the substrate surrounding the through hole (bottom coverage was about 70%). Subsequently a second layer of titanium nitride, about 800 Å thick was deposited over the surface of the titanium layer the second layer after being sputtered titanium ionized and reacted with nitrogen. Typically the thickness of the titanium nitride layer at the bottom of the hole was about 540 Å, about 65–70% of the 800 Å deposit oil the upper surface of the substrate. Finally, a third layer, of TiN$_x$, titanium was deposited over the surface of the titanium nitride layer using the ionized deposition and reactive process previously described herein. Typically the thickness of the third layer at the bottom of the hole was about 60 Å, about 60% of the thickness of the titanium layer on the upper surface of the substrate. Since the third layer formation was initiated in the same process chamber immediately after nitrogen gas flow for formation of the second layer was terminated, the third layer contained approximately 10% by weight of titanium nitride, mainly concentrated toward the initially-formed portion of the third layer. Preferably, all of the titanium containing layers are deposited in the same chamber in sequence. The through holes, lined with the preferred embodiment of the structure of the present invention, were then filled with conventionally sputtered aluminum. In particular, the aluminum was sputtered from a target of about 0.5% copper and about 99.5% aluminum, with the copper being present to enhance the electromigration resistance of the aluminum film. Initially, a layer of cold-sputtered aluminum approximately 2,000 Å thick was applied over the three-layered structure. This cold-sputtered aluminum layer, applied at a substrate temperature of about 150° C. or lower, provided a "seed" layer which adheres well to the titanium containing layer of the three-layered structure. The bulk of the aluminum contact was then deposited by sputtering at the temperature specified on the graph of FIG. 4. The aluminum was sputtered from the same target and maintaining the substrate support the same distance from the target as with the cold deposition, using conventional techniques known to those skilled in the art. The D.C. power was adjusted to give an 8000 Angstrom layer in the time specified in FIG. 4. The sputtering was carried out in a process chamber over argon pressure ranging from about 0.5 mT to about 2 mT. This corresponded to an argon feed rate of about 35 sccm in the Applied Materials 5500 Integrated Process System chamber.

The checked area 410 shown on the FIG. 4 graph represents the conditions under which sputtered aluminum could be applied during a metallization process using prior art barrier formation techniques. Although useful for some applications, these conditions do not enable the filling of a through hole having a width of $0.25\mu$ and an aspect ratio greater than 1. The diagonally-striped area 412 shown on the FIG. 4 graph (including the area underlying checked area 410) represents the conditions under which aluminum can be sputtered over the smooth barrier layer of the present invention to achieve filling of a through hole having a width of $0.25\mu$ and an aspect ratio of 5.0. Due to the lower temperature process window available, it is possible to use low temperature heating elements having a longer lifetime, to heat the substrate to lower temperatures to reduce power consumption during the aluminum sputtering process, and to enable expansion of the available materials which may be used to fill contacts by reflow.

Confirmation that the through holes were filled and void free was made using cross sectional scanning electron microscopy.

VII. SOME ALTERNATIVES

Although in the most preferred embodiment of the invention the conductor layer is provided by sputter depositing a "seed" layer of conductor material at low temperature, and then filling the remainder of the aperture with a sputter deposited conductor at high temperature, the aperture fill may be provided in other ways, such as by long throw sputtering where the substrate is positioned further from the target than its diameter, followed by sputter deposition at normal, i.e., 2 to 5 cm substrate to target spacing, ionized deposition of sputtered target material or other methods. However, the inventors have found that the lining provided by the deposition of ionized sputter material as described herein provides the greatest advantage, i.e., the greatest improvement in hole filling capability, where the conductor is provided by conventional sputtering. In particular, the lining provided by ionized sputtering allows filling of the apertures with conventional sputtering, which typically has a deposition rate at least twice that of ionized sputtering or long throw sputtering. Therefore, the invention can be used to greatest advantage by providing a cluster tool along the lines of FIG. 5, wherein at least one deposition chamber provides the carrier layer, and the other chambers provide the conductor material. Although the contact and carrier layer, the apparatus for forming the contact and carrier layer, and the methods of forming the contact and carrier layer are all described with respect to the creation of the carrier layer using physical vapor deposition techniques, applicants submit that any carrier layer having one or more of the properties of the carrier layer formed using the techniques described herein is useful for enabling filling of high aspect ratio holes using traditional sputtering techniques. Therefore, applicants submit that the carrier layer and contact of the present invention should be broadly construed, to encompass any carrier layer or sputter deposited contact over a carrier layer, wherein the carrier layer has one or more of the properties or characteristics described herein.

The above described preferred embodiments are not intended to limit the scope of the present invention, as one skilled in the art can, in view of the present disclosure expand such embodiments to correspond with the subject matter of the invention claimed below.

We claim:

1. An apparatus for filling apertures in a film layer on a semiconductor substrate, comprising:
   a) a sputter chamber which provides an ionized sputtered deposition material which forms a conformal film layer over said aperture surface, said chamber including a sputter deposition material source, a gas supply, a substrate positioning member, a first plasma generation source which produces active species used to impact said sputter deposition material source, and a second, inductively coupled RF plasma generation source which is used to ionize sputtered deposition material which passes through a plasma generated by said second plasma generation source at a location between said sputter deposition material source and said substrate;
   b) a deposition chamber which provides a source of material for deposition over said conformal film layer formed over said aperture in said sputter chamber; and
   c) a transfer chamber interconnecting said sputter chamber and said deposition chamber.

2. The apparatus of claim 1, wherein said sputter chamber further includes a reactive gas inlet for selectively introducing a gas into said sputter chamber to react with at least a portion of said ionized sputtered deposition material prior to the deposition of said ionized sputtered deposition material on said substrate.

3. The apparatus of claim 2, wherein said sputter deposition chamber includes at least a sputtering target, a gas inlet, and a power supply for supplying energy to convert a gas supplied from said gas inlet into said first plasma which impacts said target to provide said sputtered deposition material.

4. The apparatus of claim 3, wherein said sputter deposition chamber further includes a valve for at least opening and closing said reactive gas inlet, and a system controller coupled to said valve to selectively open and close said valve during sputtering of said target.

5. The apparatus of claim 4, wherein said valve is maintainable in a closed position, then an open position and then again in a closed position as said target is sputtered.

6. The apparatus of claim 5, wherein said sputtering target in said sputter deposition chamber comprises a refractory metal.

7. The apparatus of claim 6, wherein said sputtering target in said sputter deposition chamber includes titanium.

8. The apparatus of claim 7, including a gas supply for providing nitrogen.

9. The apparatus of claim 8, wherein said second plasma generation source includes at least one turn of a conductor extending about a plasma formation region in said sputter deposition chamber.

10. The apparatus of claim 1, including a power supply which is applied to said anode in said sputter deposition chamber to provide a substrate bias voltage.

* * * * *